(12) United States Patent
Karstens

(10) Patent No.: US 12,159,732 B2
(45) Date of Patent: Dec. 3, 2024

(54) BUSHING

(71) Applicant: Schneider Electric Industries SAS, Rueil-Malmaison (FR)

(72) Inventor: Michael Karstens, Salching (DE)

(73) Assignee: Schneider Electric Industries SAS, Rueil-Malmaison (FR)

( * ) Notice: Subject to any disclaimer, the term of this patent is extended or adjusted under 35 U.S.C. 154(b) by 346 days.

(21) Appl. No.: 17/904,148

(22) PCT Filed: Feb. 17, 2021

(86) PCT No.: PCT/EP2021/053886
§ 371 (c)(1),
(2) Date: Aug. 12, 2022

(87) PCT Pub. No.: WO2021/165318
PCT Pub. Date: Aug. 26, 2021

(65) Prior Publication Data
US 2023/0062847 A1    Mar. 2, 2023

(30) Foreign Application Priority Data
Feb. 17, 2020 (DE) .................. 10 2020 104 112.8

(51) Int. Cl.
*H01B 7/02* (2006.01)
*G01R 31/327* (2006.01)
*H01B 17/28* (2006.01)
*H01B 17/58* (2006.01)
(Continued)

(52) U.S. Cl.
CPC ............ *H01B 7/02* (2013.01); *G01R 31/3272* (2013.01); *H05K 1/0296* (2013.01); *H01B 17/583* (2013.01); *H05K 2201/056* (2013.01)

(58) Field of Classification Search
CPC ......... H01B 17/583; H01B 17/28; H01G 4/32
See application file for complete search history.

(56) References Cited

U.S. PATENT DOCUMENTS 3,588,319 A    6/1971    Isogai et al.
3,793,477 A *  2/1974    Wagenaar .............. H01B 17/28
                                            174/143

(Continued)

FOREIGN PATENT DOCUMENTS

EP    3 422 369 A1    1/2019
FR    1.410.807       9/1965
(Continued)

OTHER PUBLICATIONS

German Search Report issued Dec. 11, 2020 in German Patent Application No. 102020104112.8 (with English translation of Category of Cited Documents), 8 pages.
(Continued)

*Primary Examiner* — Hoa C Nguyen
*Assistant Examiner* — Amol H Patel
(74) *Attorney, Agent, or Firm* — Oblon, McClelland, Maier & Neustadt, L.L.P.

(57) ABSTRACT

A bushing for gas-insulated switchgear has an electrical conductor, which has a longitudinal axis and which is embedded in an insulating material, and a coated electrode that is arranged coaxially spaced apart from the conductor and that is formed from a plurality of segments.

14 Claims, 4 Drawing Sheets

Figure 1:
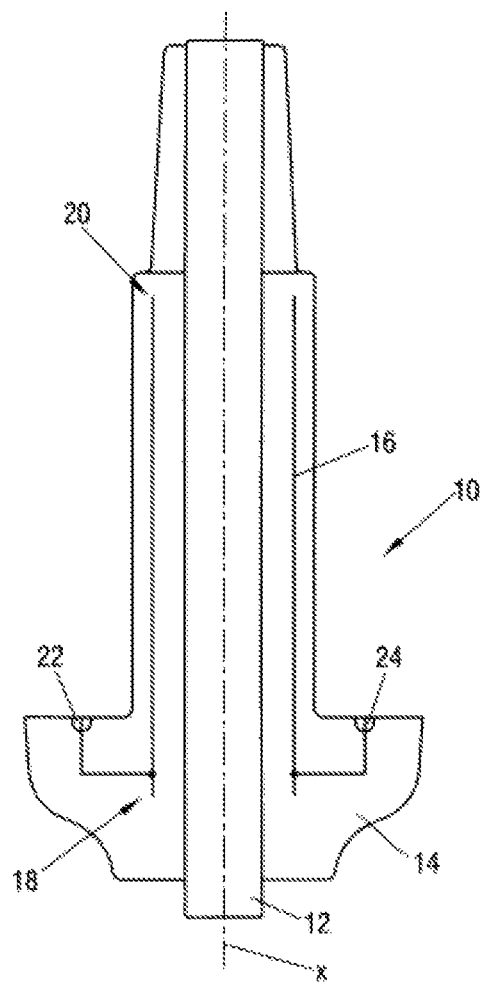

(51) Int. Cl.
*H01G 4/32* (2006.01)
*H05K 1/02* (2006.01)

(56) References Cited

U.S. PATENT DOCUMENTS

| | | | | |
|---|---|---|---|---|
| 4,227,035 A | * | 10/1980 | Runnels | H01B 17/36 |
| | | | | 174/31 R |
| 2015/0325341 A1 | * | 11/2015 | Hedlund | H01B 19/04 |
| | | | | 156/244.11 |
| 2021/0356499 A1 | * | 11/2021 | Ferraro | G01R 15/06 |

FOREIGN PATENT DOCUMENTS

| | | |
|---|---|---|
| JP | 54-125500 U | 9/1979 |
| JP | 2004-39550 A | 2/2004 |

OTHER PUBLICATIONS

International Search Report and Written Opinion issued May 12, 2021 in PCT/EP2021/053886 filed Feb. 17, 2021, 11 pages.

* cited by examiner

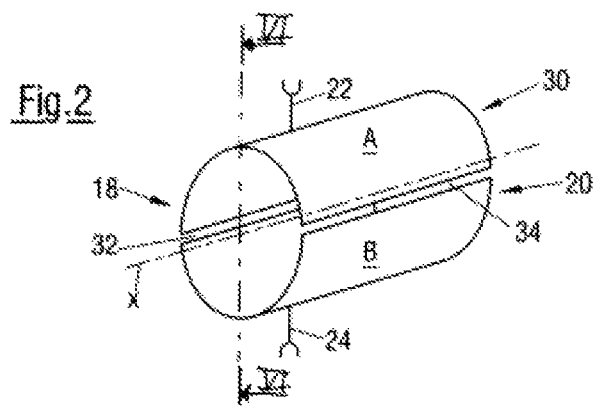
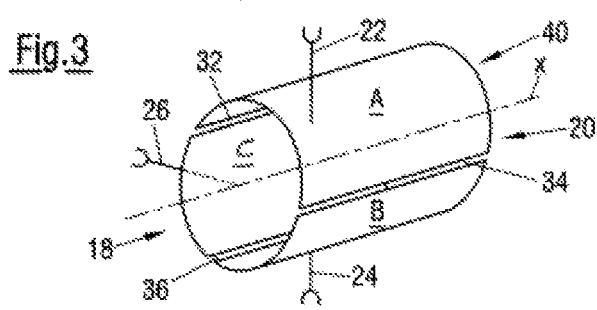
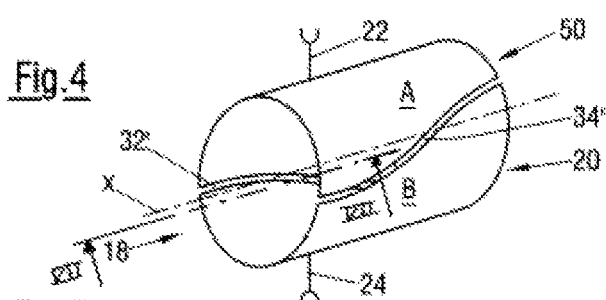
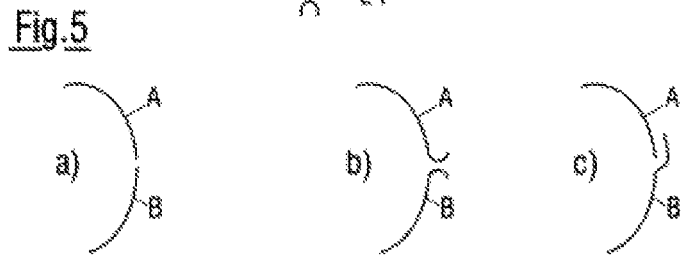

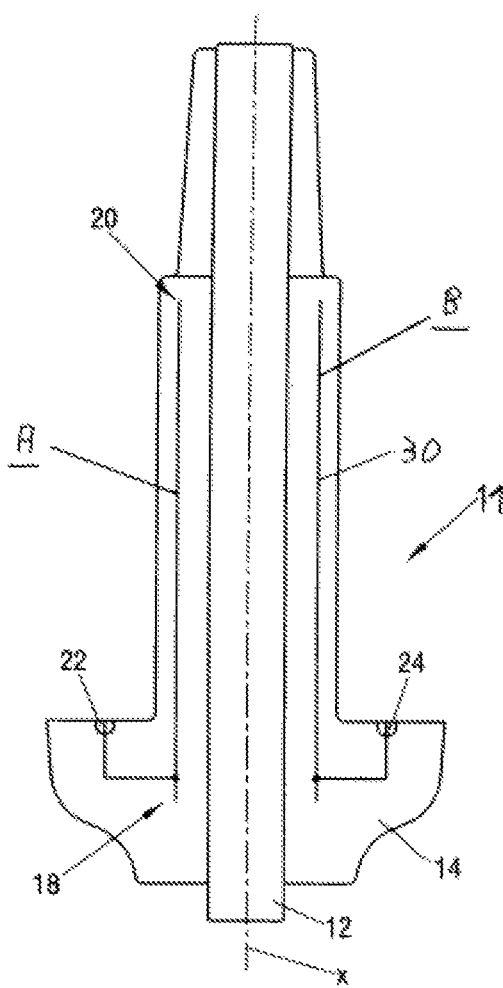

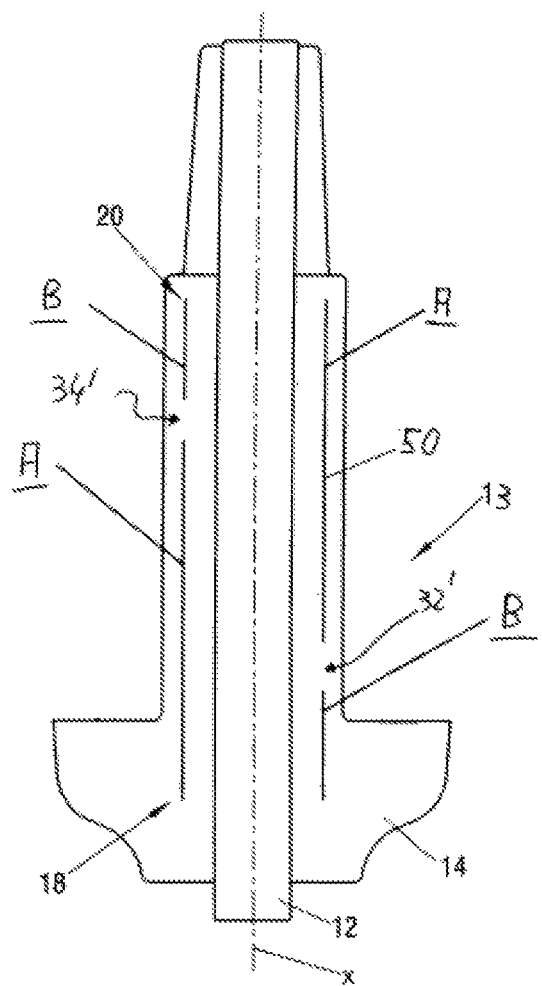

BUSHING

The present invention relates to a bushing for liquid-insulated, gas-insulated, or solid-insulated switchgear, in particular switchgear of medium-voltage technology, wherein the bushing has an electrical conductor, which has a longitudinal axis and which is embedded in an insulating material coating the conductor, and a coated electrode that is arranged coaxially to and spaced apart from the conductor and that has a first end and a second end, said coated electrode being provided with at least one electrical terminal.

Such bushings are generally known from the prior art and serve to outwardly guide the electrical conductor in an insulated manner from a space filled with gas.

FIG. 1 shows such a known bushing 10 that has an electrical conductor 12 having a longitudinal axis X, wherein the conductor 12 is embedded in an insulating material 14 coating the conductor. A coated electrode 16 arranged coaxially to and spaced apart from the conductor 12 is likewise embedded in the insulating material and has a first end 18 and a second end 20, wherein the two ends do not project from the insulating material. In the prior art shown, the coated electrode 16 is configured as a hollow cylinder that is embedded in the insulating material and that is provided with two electrical terminals 22 and 24 that are led out of the insulating material 14 in order, for example, to effect a potential control by a connection to ground potential.

It is common for the measurement of current to plug toroidal transformers onto such a bushing, which leads to increased costs, however. Furthermore, it is known to use coated electrodes directly for measuring current or voltage. However, the problem arises here that as the length of the coated electrode increases, its capacitance increases, but the maximum permissible capacitances and currents are set by regulations so that a use of the coated electrode for measuring physical quantities is not possible if a certain length is exceeded.

The object of the present invention is to further develop a bushing in accordance with the preamble of claim 1 such that a direct measurement of physical quantities with the aid of the coated electrode is possible at low manufacturing costs.

This object is satisfied by the features of claim 1 and in particular in that the coated electrode has at least two interruptions extending in an axial direction, i.e. in the direction of the longitudinal axis, from the first end up to the second end, whereby at least two segments are formed that are electrically insulated from one another and that are provided with respectively at least one electrical terminal.

With the solution in accordance with the invention, the desired field control can still be achieved. However, the capacitance of the two segments of the coated electrode is reduced in accordance with the number of segments. If, for example, two segments are present, half the capacitance compared to a coated electrode without interruptions, which has the same length, results for each segment. In this way, measurement devices for different physical quantities such as voltage, temperature or also measurement devices for measuring partial discharges can be connected to the electrical terminals of the segments that are electrically insulated from one another.

The bushing in accordance with the invention can—in particular compared to bushings that have a metallization outwardly applied to the insulating material—be manufactured very inexpensively and can be used in a variety of manners due to the increased possibility of connecting electrical measurement devices.

Advantageous embodiments of the invention are described in the description, in the drawing, and in the dependent claims.

In accordance with a first advantageous embodiment, two segments can be formed as half-shells, whereby a symmetrical design and a connection of at least two different measurement devices result.

Furthermore, it can be advantageous if at least one interruption extends in a straight line, which lowers the manufacturing costs and effects a uniform potential distribution.

However, the interruptions do not have to extend symmetrically or in a straight line. Rather, it can also be advantageous if at least one interruption extends in a curved manner or extends revolving in a helical manner. In the region of the interruption, the two segments are always embedded in the insulating material and are insulated from one another by the insulating material. However, it can be advantageous if at least two segments mutually overlap along an interruption (insulated by the insulating material). Likewise, a beading over of the two segments along the interruption can be advantageous. It can also be advantageous if the two segments abut in a blunt manner (but spaced apart).

To achieve particularly uniform ratios, it can be advantageous if the size of the jacket surface of all segments is the same.

On the other hand, it can also be advantageous if individual segments have a different size, i.e. a different jacket surface, since capacitances of different sizes can hereby be achieved. Thus, it is, for example, possible to provide a segment that extends over 240° and to provide a second segment that extends over approximately 120°. Alternatively, a division is also possible in which one segment is provided that extends over 180° and two further segments each extend over approximately 90°.

In accordance with a further advantageous embodiment, the segments are embedded in the insulating material except for the electrical terminals.

The present invention will be described in the following purely by way of example with reference to advantageous embodiments and to the enclosed drawings. There are shown:

FIG. 1 a cross-section through a bushing in accordance with the prior art;

FIG. 2 to FIG. 4 different embodiments of a coated electrode;

FIGS. 5a) to c) different embodiments of two segments in the region of the interruption;

FIG. 6 a cross-section section through a bushing having a coated electrode of FIG. 2; and FIG. 7 a cross-section through a bushing having a coated electrode of FIG. 4.

FIG. 2 shows a first embodiment of a coated electrode 30 having a first end 18 and a second end 20, wherein the coated electrode has two continuous interruptions 32 and 34 between the first end 18 and the second end 20, whereby, in the embodiment shown, the coated electrode is so-to-say divided in the longitudinal direction X and two segments A and B are thereby formed that are completely embedded in the insulating material, that are electrically insulated from one another by the insulating material, and that each have an electrical terminal 22 and 24. In the embodiment shown of FIG. 2, the two segments A and B are each formed as half-shells, wherein each half-shell has the shape of a hollow cylindrical half cylinder. Accordingly, the two interruptions 32 and 34 extend symmetrically and in a straight line, wherein the spacing of the two segments in the region of the interruptions is the same in each case.

FIG. 3 shows a further embodiment of a coated electrode 40 in which a total of three segments A, B and C are provided, between each of which an interruption 32, 34 and 36 extends, wherein all interruptions extend from the first end 18 up to the second end 20 of the coated electrode 40 in the longitudinal direction X. In this embodiment, three segments are therefore provided with three interruptions, wherein the maintenance of the interruptions is ensured by the embedding of the segments in the insulating material.

FIG. 4 shows a further embodiment of a coated electrode 50 having two segments A and B that are formed by two interruptions 32' and 34' that extend in a curved manner and approximately in a helical manner. Here, too, each segment A and B is provided with respectively one electrical terminal 22 and 24.

FIG. 5 shows different possibilities of how the segments can be formed in the region of the interruption. For example, in FIG. 5a), a butt joint of two segments A and B is shown such as is implemented in the embodiments of FIGS. 2, 3, and 4. Alternatively, adjacent segments A and B can also be outwardly beaded over or outwardly arched in the region of the interruption, as is shown in FIG. 5b). Alternatively or additionally, an overlapping design of the two segments A and B can be considered, for example in accordance with the embodiment of FIG. 5c).

The coated electrode or the segments can be made from a wire mesh in a generally known manner and can be outwardly curved or arched in the region of the first and/or the second end 18, 20.

Alternatively, it is possible to design the coated electrode as a flexible circuit board, for example as a plastic film, wherein the different segments are applied as areal surfaces or surfaces provided with an interruption on an insulating carrier material.

Alternatively, the segments of the coated electrode can also be formed by a conductive or semiconductive plastic, for example, by adding graphite.

FIG. 6 shows a longitudinal section through a bushing 11 having the coated electrode 30 of FIG. 2, wherein the latter is cut along the line VI-VI of FIG. 2. The bushing 11 has an electrical conductor 12 having a longitudinal axis X, wherein the conductor 12 is embedded in an insulating material 14 coating the conductor. The coated electrode 30 of FIG. 2 arranged coaxially to and spaced apart from the conductor 12 is likewise embedded in the insulating material and has a first end 18 and a second end 20, wherein the two ends do not project from the insulating material. The coated electrode 30 is provided with the two electrical terminals 22 and 24 that are led out of the insulating material 14 in order, for example, to be able to measure different physical quantities through a connection to respectively one measurement device. This is possible since the segments A and B of the coated electrode 30 are embedded in the insulating material and are galvanically separated.

FIG. 7 shows a longitudinal section through a further bushing 13 having the coated electrode 30 of FIG. 4, wherein the latter is cut along the line VII-VII of FIG. 4. The bushing 13 has an electrical conductor 12 having a longitudinal axis X, wherein the conductor 12 is embedded in an insulating material 14 coating the conductor. The coated electrode 30 of FIG. 4 arranged coaxially to and spaced apart from the conductor 12 is likewise embedded in the insulating material and has a first end 18 and a second end 20, wherein the two ends do not project from the insulating material. The coated electrode 50 is provided with the two electrical terminals 22 and 24 that are not visible in FIG. 7 and that are led out of the insulating material 14, in order, for example, to be able to measure different physical quantities through a connection to respectively one measurement device. This is possible since the segments A and B of the coated electrode 50 are embedded in the insulating material and are galvanically separated. As FIG. 7 shows, the coated electrode 50 is provided with the two interruptions 32' and 34'.

The coated electrodes in accordance with the invention can extend in the axial direction over a length that, for example, corresponds at least to the diameter of the conductor 12. The axial length of the coated electrode can in particular be twice, three times, or six to seven times the diameter of the conductor.

The invention claimed is:

1. A bushing for a switchgear, the bushing comprising:
   an electrical conductor, which has a longitudinal axis and which is embedded in an insulating material coating the conductor; and
   a coated electrode that is arranged coaxially to and spaced apart from the conductor and that has a first end and a second end, the coated electrode being embedded in the insulating material and being provided with at least one electrical terminal,
   wherein the coated electrode has at least two interruptions extending in an axial direction from the first end up to the second end, forming at least two segments, and
   the at least two segments are electrically insulated from one another and are provided with at least one terminal, respectively.

2. The bushing in accordance with claim 1, wherein the switchgear is a medium-voltage switchgear.

3. The bushing in accordance with claim 1, wherein the at least two segments are formed as half-shells.

4. The bushing in accordance with claim 1, wherein at least one of the interruptions extends in a straight line.

5. The bushing in accordance with claim 4, wherein all of the at least two interruptions extend in a straight line.

6. The bushing in accordance with claim 1, wherein the coated electrode is configured as a flexible circuit board in which the at least two segments are arranged as conductor paths on an insulating carrier material.

7. The bushing in accordance with claim 1, wherein the at least two segments are formed by a conductive plastic or a semiconductive plastic.

8. The bushing in accordance with claim 1, wherein at least one of the at least two interruptions extends in a curved manner.

9. The bushing in accordance with claim 8, wherein the at least one of the at least two interruptions extends in a helical manner.

10. The bushing in accordance with claim 1, wherein the at least two segments overlap along an interruption.

11. The bushing in accordance with claim 1, wherein at least two adjacent segments are provided with an outwardly arched beaded-over portion along an interruption.

12. The bushing in accordance with claim 1, wherein the at least two segments extend in an axial direction over a length that corresponds at least to a diameter of the conductor.

13. The bushing in accordance with claim 1, wherein sizes of insulating material surfaces of the at least two segments are different.

14. The bushing in accordance with claim 1, wherein respectively one measurement device that measures a different physical quantity is connected to the at least one terminal.

* * * * *